United States Patent [19]

Lesk

[11] Patent Number: 5,436,498
[45] Date of Patent: Jul. 25, 1995

[54] GETTERING OF IMPURITIES BY FORMING A STABLE CHEMICAL COMPOUND

[75] Inventor: Israel A. Lesk, Phoenix, Ariz.

[73] Assignee: Motorola, Inc., Schaumburg, Ill.

[21] Appl. No.: 191,678

[22] Filed: Feb. 4, 1994

[51] Int. Cl.$^6$ .................. H01L 21/324; H01L 21/76; H01L 29/167

[52] U.S. Cl. .................. 257/612; 257/610; 257/617; 257/928; 437/10; 437/13; 437/21

[58] Field of Search .............. 257/610, 612, 617, 906, 257/913, 925, 924, 928, 607; 437/10–13; 148/DIG. 60, DIG. 61

[56] References Cited

U.S. PATENT DOCUMENTS

| | | | |
|---|---|---|---|
| 4,489,480 | 12/1984 | Martin et al. | 257/612 |
| 4,504,334 | 3/1985 | Schaake et al. | 437/12 |
| 4,868,133 | 9/1989 | Huber | 437/10 |
| 4,881,115 | 11/1989 | Lesk et al. | 257/612 |
| 5,308,776 | 5/1994 | Gotou | 437/62 |

FOREIGN PATENT DOCUMENTS 1243549  9/1989  Japan .................. 437/12

*Primary Examiner*—Mahshid Saadat
*Attorney, Agent, or Firm*—Robert D. Atkins

[57] ABSTRACT

Reactor atoms (22) are introduced into a silicon substrate (10) by ion implantation to combine with metal impurities (18) to form stable chemical compounds (24). The stable compounds do not decompose and release the metal impurities during subsequent processing steps. Such metal impurities are detrimental to semiconductor devices formed in active regions (16, 17) in the silicon substrate. The reactor atoms such as sulfur are chosen to be substantially immobile in silicon at normal semiconductor processing temperatures. The metal impurities such as iron are effectively gettered to increase performance and reliability of semiconductor devices formed in the active regions (16, 17) in the silicon substrate.

11 Claims, 1 Drawing Sheet

GETTERING OF IMPURITIES BY FORMING A STABLE CHEMICAL COMPOUND

BACKGROUND OF THE INVENTION

The present invention relates in general to semiconductor manufacturing and, more particularly, to the gettering of impurities in a semiconductor.

In silicon, metal impurities, particularly the heavy metallic impurities such as iron, copper, and nickel, can produce deep energy level sites causing undesirable generation and recombination of minority carriers in the active regions of the substrate. Some metal impurities diffuse very rapidly in silicon at modest temperatures, and due to their low solubility can form precipitates. When these precipitates form at the silicon/silicon dioxide interface, the barrier height for electron transfer from the silicon to the oxide is reduced and the sites become high current density paths that result in premature oxide failure. If these precipitates form at or near a reverse biased P-N junction of the semiconductor device, leakage current from the P-N junction will increase because of the high minority carrier generation rate. Accordingly, device performance degrades, or the semiconductor device may fail.

The metal impurities can arise from a variety of sources. For example, metal impurities may come from placing a material on the wafer surface during processing, or from the processing equipment itself. Once the metal impurities reside on an exposed silicon region of the wafer, subsequent high temperature processing allows the metal impurities to diffuse throughout the substrate. A variety of techniques have been proposed to reduce the concentration of contaminants including ultra clean processing, cleaning processes and gettering.

Ultra clean processing reduces contamination in the manufacturing process thus lowering the level of contamination that reaches the silicon substrate. Ultra clean processing involves sophisticated ultra clean factories, and the use of ultra pure chemicals and gases. While ultra clean processing has been successful in reducing the level of metallic contamination, it is very costly. In addition it is merely a preventative method and provides no means for trapping impurities that enter the silicon.

Various wet, dry and high temperature (pyrochemical) cleaning processes have been developed. While these methods remove impurities from the substrate, some degree of redeposition exists at the end of each cleaning process, thus limiting their effectiveness.

Substrate gettering techniques and structures have been the mainstay of the semiconductor industry. Although several different techniques have been developed, each involves the production of low energy sites that can trap the mobile impurities. Among the most prevalent techniques are various forms of backside damage, including mechanical abrasion, silicon nitride or polysilicon deposition, and argon implantation. More recently, techniques for producing damage on the front side of substrates, but away from active semiconductor areas, have been developed. The front side techniques tend to be more permanent than the backside processes.

Another common method is oxygen precipitation gettering, sometimes called denuded zone intrinsic gettering. In this method a wafer with a specific range of oxygen concentration is processed through particular cycles of heating and cooling to produce denuded zones near the top and bottom surfaces of the substrate and with a high concentration of oxygen precipitates in-between the denuded zones. The oxygen precipitates serve as gettering sites for the mobile impurities.

There are two basic gettering techniques: damage gettering and oxygen precipitate gettering. Unfortunately, oxygen precipitate gettering is not very effective in gettering some impurities such as iron because iron does not form stable precipitates at the oxygen precipitate sites. Hence, the iron impurities may be re-emitted into the silicon substrate upon subsequent processing. Damage gettering loses effectiveness with subsequent high temperature processing which anneals much of the damage. In addition, neither technique is applicable to gettering in polysilicon layers, separated from the substrate by a dielectric layer.

Accordingly, a need exists for gettering mobile impurities that is applicable to silicon and polysilicon layers where the impurities remain gettered during subsequent processing.

DETAILED DESCRIPTION OF THE PREFERRED EMBODIMENT

Figure 1:
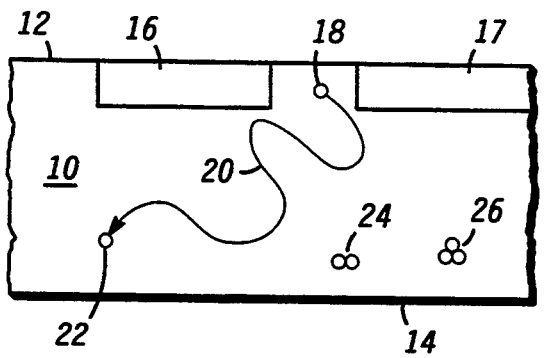
FIG. 1 illustrates a silicon substrate with reactor atoms combining with metal impurities to form stable compounds.

Referring to FIG. 1, a silicon substrate 10 is shown having a front surface 12 and a back surface 14. Semiconductor devices are formed in active regions 16 and 17. The processes of forming active semiconductor devices into front surface 12, including ion implantation, oxidation, photolithography, diffusion, cleaning, etching, and chemical vapor deposition, are well known to those skilled in the art of silicon process technology.

During each process step, metal impurities 18 may be left at or near front surface 12. When substrate 10 is heated during processing, metal impurity 18 may penetrate and diffuse throughout the silicon substrate very rapidly. For example, at 1000° C., copper diffuses through thirty mils of silicon substrate in about sixty seconds. In the absence of any appreciable concentration gradient, metal impurity 18 follows a random path as suggested by path 20. It is desirable to keep metal impurities away from active regions 16 and 17 to prevent generation and recombination of minority carriers which degrades performance, or possibly causes failure of the active semiconductor devices.

As one feature of the present invention, reactor atoms 22 are introduced into specific regions of substrate 10. The reactor atoms do not react appreciably with the silicon in substrate 10, and thus are substantially immobile and remain within specific regions during subsequent processing. Reactor atoms 22, e.g. sulfur, are chosen to form stable chemical compounds with mobile metal impurities, e.g. iron, that diffuse in close proximity to and collide with the reactor atoms. The stable chemical compounds do not decompose during subsequent processing, so the mobile impurities bonded in the stable compounds remain substantially immobilized, or gettered, at the reactor atom sites.

In the prior art, metal impurities are typically gettered by precipitation at oxygen precipitate sites. However, some of the metal impurities are likely to detach from their precipitate sites during subsequent processing and potentially diffuse into the active semiconductor regions. Thus, some metal impurities gettered at oxygen precipitate sites do not form stable precipitates. Notable among these metal impurities that do not form stable precipitates is iron. In contrast, the present invention substantially immobilizes the metal impurities by forming stable compounds, e.g. iron bonds with sulfur to form $FeS_2$. The stable compounds formed by the present invention do not decompose and release the metal impurities during subsequent processing steps. Metal impurities are thus kept away from the active semiconductor regions.

In FIG. 1, reactor atom 22 is introduced into silicon substrate 10 through back surface 14. Reactor atom 22 may be introduced by ion implantation and other well known methods such as diffusion. Reactor atom 22 is chosen to be relatively immobile in silicon so that it remains substantially fixed in a region within substrate 10. Reactor atom 22 is chemically reactive with metal impurity atom 18. When the temperature becomes sufficiently high, say 800°–1000° C., and metal impurity 18 passes in the attractive vicinity so as to collide with reactor atom 22, a chemical bonding occurs to form a stable chemical compound 24. Metal impurity 18 is thus gettered to reactor atom 22 to prevent its random motion around substrate 10 and possible introduction into active regions 16 and 17.

Reactor atom 22 is further chosen such that the chemical compound formed with metal impurity 18 is stable during subsequent high temperature processing steps. In order that reactor atom 22 remains free to bond to metal impurity 18, it must be chosen so that it does not react with silicon which would be detrimental to the bonding with metal impurity 18. Alternately, sufficient reactor atoms 22 may be introduced into the silicon in close proximity to one another so that the solid solubility of the reactor atoms in silicon is exceeded. Reactor atom 22 may also form more complex chemical compounds with more than two atoms, e.g. one bond with metal impurity 18 and another bond with a silicon atom as illustrated by the more complex chemical compound 26 of FIG. 1.

The metal impurities 18 that are highly mobile in silicon and thus are of concern as contaminants during semiconductor manufacture include iron, copper, nickel, zinc, and lithium. Reactor atoms 22 that are substantially immobile in silicon and that can form stable compounds with mobile contaminating atoms 18 are selected from Group VIA of the periodic table. Choices of reactor atoms 22 include sulfur, selenium and tellurium. Sulfur has a solid solubility of less than $10^{17}/cm^3$ in silicon. Thus, an implant of $2 \times 10^{14}/cm^2$ of reactor atoms within a depth of 2000 angstroms giving an average sulfur concentration of $10^{19}/cm^3$ would provide sufficient free reactor atoms to react with the mobile impurities. A sulfur source for ion implantation is sulfur hexafluoride ($SF_6$) ionized in a plasma. Implant energies are the same as those commonly utilized for donor and acceptor implant into silicon, say 20–120 KV. Doses higher than $2 \times 10^{14}/cm^2$ may be used where contamination is extreme.

It is important that the implanted reactor atoms combine with the metal impurity to form a stable chemical compound. Chemical compounds with high melting points are indicative of stable compounds. Some examples of compounds that would substantially immobilize iron impurity atoms within typical temperature processing limits include iron sulfide (FeS) with a melting point of 1195° C. and iron pyrite ($FeS_2$) with a melting point of 1171° C. Other examples of stable compounds utilizing Group VIA reactor atoms include $Cu_2Se$, $Cu_2S$, ZnTe, ZnSe, NiSe, $Ni_3S_2$ and $Li_2S$. In addition, multiple types of reactor atoms may be implanted to take advantage of individual reactor atoms reactivity with specific metal impurities. For example, sulfur and selenium reactor atoms may be implanted to getter metal impurities copper and zinc to form stable chemical compounds $Cu_2S$ and ZnSe, respectively.

Figure 2:
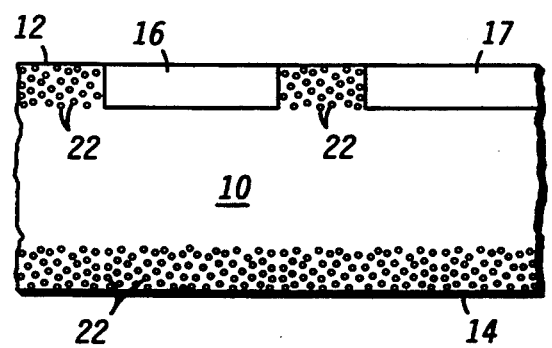
FIG. 2 illustrates reactor atoms implanted in front and back surfaces of the substrate.

Turning to FIG. 2, substrate 10 is shown with reactor atoms 22 implanted through front surface 12 into gettering regions around active regions 16 and 17. In addition, reactor atoms 22 are introduced through back surface 14 by way of ion implantation to form another gettering region. The gettering regions collect impurities that combine with reactor atoms 22 contained therein to form stable chemical compounds. During wafer processing, rapidly diffusing metal impurities may enter substrate 10 through active regions 16 and 17 where silicon is exposed. The impurities diffuse throughout substrate 10 and bond to reactor atoms 22 to form the stable chemical compounds, thereby preventing generation and recombination of minority carriers in active regions 16 and 17 by the impurities.

Figure 3:
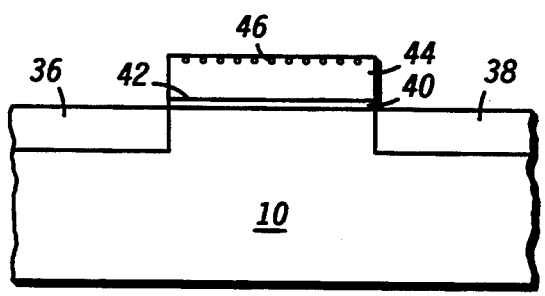
FIG. 3 illustrates an MOS transistor with reactor atoms implanted in the gate region.

In FIG. 3, an MOS transistor is shown fabricated in substrate 10. The MOS transistor includes source region 36 and a drain region 38. Gate oxide layer 40 is formed above the channel between source region 36 and drain region 38. Gate oxide layer 40 may be composed of thermally grown or deposited layers of $SiO_2$. A polysilicon gate 44 is formed at interface 42 of gate oxide 40. It is known that mobile metal impurities may be present in the polysilicon, possibly introduced during the polysilicon deposition cycle or during subsequent processing. Reactor atoms 46 are introduced by ion implantation into the top surface of polysilicon gate 44 to bond with the metal impurities to form stable compounds. The reactor atoms thus getter the metal impurities and prevent the latter from precipitating in polysilicon gate 44 adjacent to gate oxide interface 42 where they would have a detrimental effect on performance and reliability of the MOS transistor.

Figure 4:
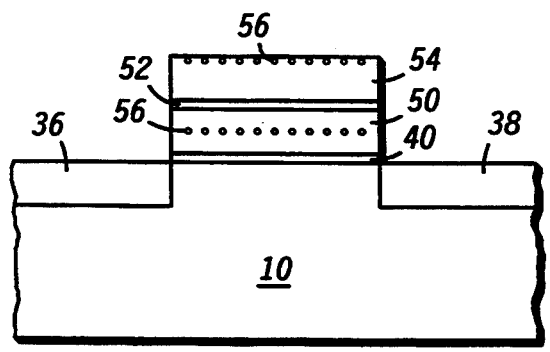
FIG. 4 illustrates an MOS transistor with reactor atoms implied in the control gate and floating gate.

FIG. 4 illustrates an MOS transistor with two polysilicon gate regions 50 and 54. Components having a similar function are assigned the same reference numbers used in FIG. 3. Gate region 50 is formed on gate oxide layer 40 above the channel between source region 36 and drain region 38. Gate oxide layer 52 separates gate regions 50 and 54. Gate oxide layer 52 and polysilicon gate regions 50 and 54 form a capacitor. Gate oxide layer 40 and interpoly gate oxide layer 52 are dielectrics composed of thermally grown or deposited layers of $SiO_2$. Alternately, gate oxide layers 40 and 52 may be layered structures such as superimposed thermal and deposited $SiO_2$ layers, or oxide-nitride-oxide (ONO) sandwiches. Polysilicon gate 54 operates as the control gate for gate region 50 in a floating gate configuration of a memory device such as an EPROM or EEPROM. Alternatively, gate region 50 may operate as the gate of an MOS transistor having source region 36 and drain region 38.

It is desirable to keep metal impurities away from polysilicon-silicon dioxide interfaces between gate oxide layer 40 and gate region 50, between gate region 50 and gate oxide layer 52, and between gate oxide layer 52 and gate region 54. The metal impurities may precipitate at the interfaces and degrade the performance of the memory device. Accordingly, reactor atoms 56 are ion-implanted into polysilicon gate regions 50 and 54. The reactor atoms are implanted at or near the top surface of gate region 54 as shown. The reactor atoms getter the metal impurities and prevent precipitating at the interface between gate region 54 and gate oxide layer 52 which could have a detrimental effect on performance and reliability of the MOS transistor.

Reactor atoms 56 are introduced into polysilicon gate region 50 in an area approximately at one-half of its thickness. A first layer of gate region 50 is formed on gate oxide layer 40 one-half its total thickness. The reactor atoms are ion-implanted into the top of the first layer. The remaining thickness of polysilicon gate region 50 is then deposited. Any mobile metal impurities entering polysilicon gate region 50 bond to reactor atoms 56 to form stable compounds away from polysilicon-silicon oxide interfaces. The reactor atoms thus getter the metal impurities and prevent precipitating at the interface between gate oxide layer 52 and gate region 50, and between gate region 50 and gate oxide layer 40.

By now it should be appreciated that the reactor atoms do not react appreciably with the silicon in substrate 10, but remain within the specific regions during subsequent processing. The reactor atoms are chosen to form stable chemical compounds with mobile metal impurities that diffuse in close proximity so as to collide with the reactor atoms. The stable chemical compounds do not decompose, i.e. impurities detach from the reactor atoms, during subsequent processing. The mobile impurities thus become immobilized at the reactor atom sites. The reactor atoms may be introduced broadly into the back side of the substrate, and into unused areas such as scribe grids in the front side of the substrate. The reactor atoms may also be introduced into polysilicon gate layers of MOS transistors.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A semiconductor substrate comprising a gettering region that includes a reactor element which combines with an impurity to form a chemical compound that immobilizes said impurity.

2. The semiconductor substrate of claim 1 wherein said reactor element includes sulfur.

3. The semiconductor substrate of claim 1 wherein said reactor element includes selenium.

4. The semiconductor substrate of claim 1 wherein said reactor element includes tellurium.

5. The semiconductor substrate of claim 1 wherein said impurity includes iron, copper, or nickel.

6. A polysilicon region in a semiconductor device comprising a gettering region for immobilizing an impurity by combining said impurity with a reactor element in said gettering region to form a chemical compound that immobilizes said impurity.

7. The polysilicon region of claim 6 includes said gettering region in a gate of an MOS transistor.

8. The polysilicon region of claim 7 wherein said reactor element includes sulfur.

9. The polysilicon region of claim 7 wherein said reactor element includes selenium.

10. The polysilicon region of claim 7 wherein said reactor element includes tellurium.

11. The polysilicon region of claim 6 wherein said impurity includes iron, copper, or nickel.

* * * * *